United States Patent
Meyer et al.

(10) Patent No.: US 6,533,908 B1
(45) Date of Patent: Mar. 18, 2003

(54) DEVICE AND METHOD FOR COATING SUBSTRATES IN A VACUUM UTILIZING AN ABSORBER ELECTRODE

(75) Inventors: Carl-Friedrich Meyer, Pappritz (DE); Hans-Joachim Scheibe, Dresden (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/763,636
(22) PCT Filed: Aug. 20, 1999
(86) PCT No.: PCT/EP99/06128
§ 371 (c)(1),
(2), (4) Date: Mar. 12, 2001
(87) PCT Pub. No.: WO00/13201
PCT Pub. Date: Mar. 9, 2000

(30) Foreign Application Priority Data

Aug. 26, 1998 (DE) .......................... 198 38 827
Oct. 31, 1998 (DE) .......................... 198 50 218

(51) Int. Cl.⁷ .............................................. C23C 14/54
(52) U.S. Cl. .................... 204/192.37; 204/298.06; 204/298.41; 427/580; 427/596; 118/723 VE; 118/723 MP; 118/723 FI
(58) Field of Search ........................ 204/192.38, 298.41, 204/298.06; 427/580, 596; 118/723 VE, 723 MP, 723 FI

(56) References Cited

U.S. PATENT DOCUMENTS

| | | |
|---|---|---|
| 5,254,832 A | 10/1993 | Gartner et al. |
| 5,698,273 A | 12/1997 | Azad et al. |
| 5,858,478 A * | 1/1999 | Radhakrishnan ............ 427/294 |

FOREIGN PATENT DOCUMENTS

| | | |
|---|---|---|
| DE | 3901 401 | 9/1989 |
| DE | 279 695 | 6/1990 |
| DE | 195 38 110 | 4/1997 |
| EP | 437 890 | 7/1991 |
| JP | 5-279844 | 10/1993 |
| JP | 05-279844 | * 10/1993 |

OTHER PUBLICATIONS

U.S. patent application Ser. No. 09/763,650, Scheibe et al., filed Feb. 26, 2001.
Coll, Bernard F. et al. "Design of Vacuum Arc–Based Sources", First Australia–USA Workshop on Critical Issues in High Performance Wear Resistant Films, Wollongong, NSW Australia, 1–3 (Feb., 1995).
Duden Deutsches Universalwörterbuch, p. 384, Bibliographisches Institut & F.A. Brockhaus AG, Mannheim (1996).

* cited by examiner

*Primary Examiner*—Timothy Meeks
(74) *Attorney, Agent, or Firm*—Leydig Voit & Mayer, Ltd.

(57) ABSTRACT

The invention relates to a device and method for coating substrates in a vacuum, wherein a plasma is to be generated from a target and ionized particles of the plasma are to be deposited on the substrate in the form of a layer, as has long been used in a very wide range of known PVD processes. The intention of the invention is to prevent droplets and particles from settling in the applied layer, which droplets and particles have an adverse effect on the properties of the layer, or at least to reduce the number of these droplets and particles. To solve this problem, an absorber electrode which is at an electrically positive potential is used, which electrode is a few mm away from the root of the plasma, and is arranged in front of or next to the plasma in such a way and is shaped in such a way that an electric field is formed around the absorber electrode. The electric field vector is to be oriented at least approximately orthogonally to the direction of movement of the ionized particles of the plasma.

19 Claims, 9 Drawing Sheets

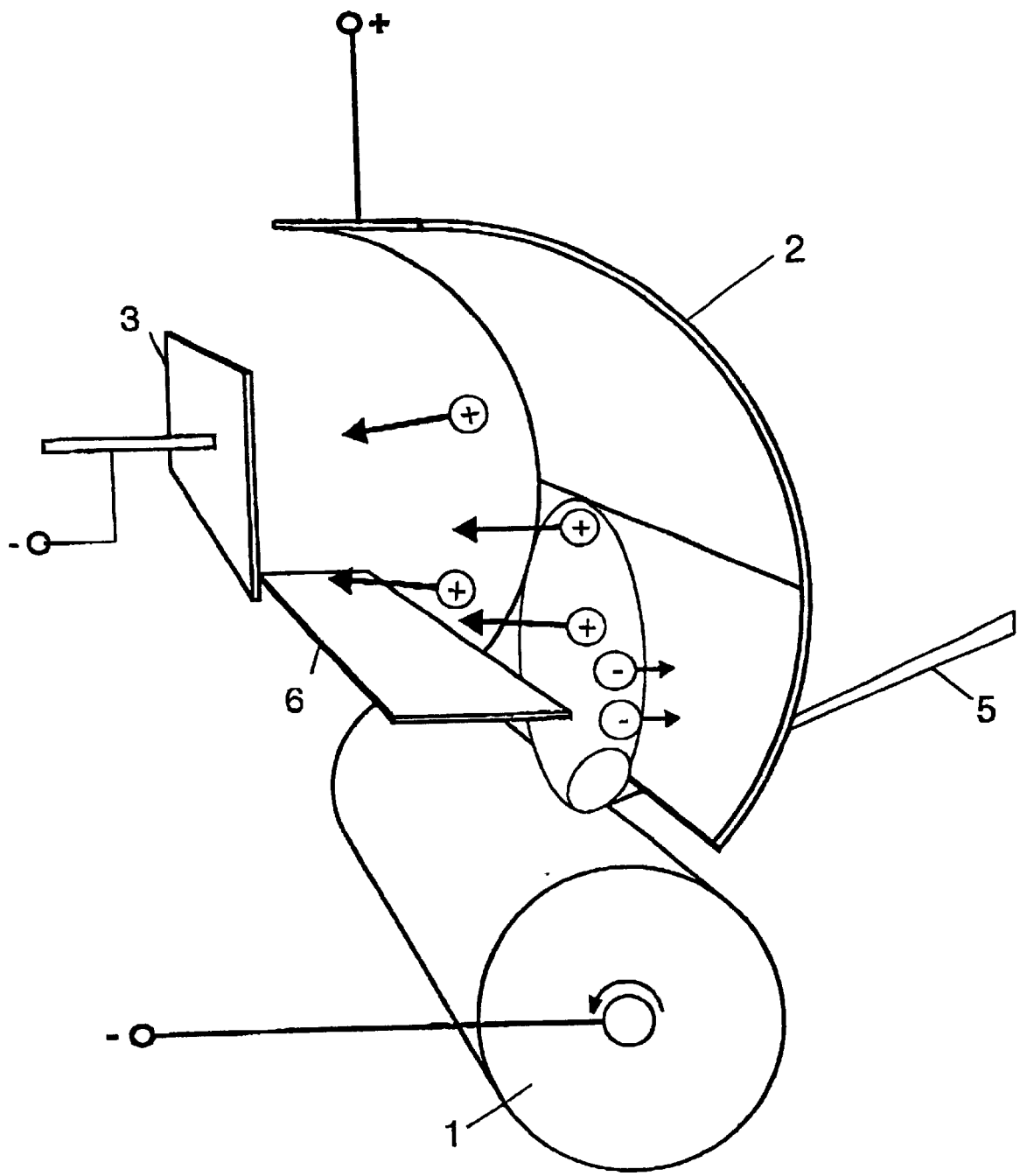
Figur 6

DEVICE AND METHOD FOR COATING SUBSTRATES IN A VACUUM UTILIZING AN ABSORBER ELECTRODE

The invention relates to a device and methods for coating substrates in a vacuum, wherein a plasma is to be generated from a target and ionized particles of the plasma are to be deposited on the substrate in the form of a layer, as have long been successfully used for a very wide range of known PVD processes.

In particular, the invention can be used to supplement the so-called laser arc method, in which an arc discharge in a vacuum can be ignited by means of a pulsed laser beam and the ionized flow of particles can be guided to a substrate together with the plasma obtained by means of the arc discharge and the ionized particles can be deposited on this substrate in the form of a layer. However, the invention may also be employed in a method which is known per se and in which an arc discharge in a vacuum is used to generate the plasma without the arc discharge being initiated by a laser beam. In this case, the arc discharge can in a known way either be ignited solely by a sufficiently high voltage between an anode and a target connected as cathode, and secondly it is possible to initiate the ignition by means of electrically conductive ignition elements as a result of short-circuiting.

A further possibility in which the solution according to the invention can be employed to good effect is the generation of a plasma on a target by area is restricted to approx. 150 mm on account of the powerful magnetic fields required and the electric power required for this purpose. The coating rate achieved by the methods is reduced to approx. 15–20% symbol compared to that without use of the filter.

Furthermore, JP 05-279844 A Patent Abstracts of Japan, Vol. 018, No. 068 (C-1161) describes a device for coating substrates in a vacuum. In this case, a plasma is generated by means of a laser beam which is directed onto a target. The electrically charged and neutral plasma particles pass from the target to the substrate; in this case, the electrons are to be absorbed by the electrodes using two electrodes, which are arranged parallel to and opposite one another and are oriented orthogonally to the target surface, through the application of a voltage of a level of 1000 V.

Therefore, it is an object of the invention to reduce the proportion of droplets and particles in a layer which is applied to a substrate using a PVD method, while at the same time allowing relatively large-area coating.

This objective preferably is achieved by the characterizing features of the inventive devices and methods for coating substrates in a vacuum. Advantageous embodiments and refinements of the invention will be apparent from the description provided herein.

According to the invention, the procedure is that an additional absorber electrode, which is at an electrically positive potential with respect to the plasma, is used, and an electric field is generated around this absorber electrode. Ionized particles and electrons of a plasma are passed through this electric field, with the result that electrically negative particles are absorbed by the absorber electrode and positive particles, preferably with a low mass/charge ratio of the plasma, reach the substrate. Neutral particles and particles with a high mass/charge ratio are only insignificantly affected in terms of their reference size and can therefore be separated.

Compared to the known magnetic filter systems which are in use, an absorber electrode of this type is significantly easier and less expensive to produce and operate.

A particularly advantageous embodiment of the invention consists in the invention being used in a device in which a pulsed vacuum arc discharge with a pulsed laser beam which is directed at the surface of a target connected as cathode is used. Such devices together with the corresponding methods are described, for example, in DE 39 01 401 C2 and, in improved form, in DD 279 695 B5. The vacuum arc discharge for generating a plasma is ignited between the target and an anode, and the ionized particles of the plasma are then deposited on a substrate in the form of a layer. A very wide variety of shapes can be used for the form of the anode and the target employed, and a very wide range of target materials can be employed. In methods as described, for example, in DD 279 695 B5, the drawbacks of the relatively large particles being deposited in the layer which are known from the prior art still occur. To counteract this, according to the invention an additional absorber electrode is used, which is held at an electrically more positive potential than the anode which may in any case already be present. With this arrangement, it is possible to separate the differently charged particles of the ionized particle flow out of the plasma, the electrically negative particles being at least for the most part absorbed by the absorber electrode and, in the form which is desired according to the invention, only the electrically positive particles of the particle flow passing through an electric field generated around an absorber electrode and onto the substrate. In this context, it is particularly beneficial for the distance between the anode and the absorber electrode to be relatively short, for example to be limited to about a few mm.

However, the invention may also be employed in a device or a method in which the plasma is generated exclusively by means of an arc discharge in a vacuum, as described, inter alia, in DD 280 338 B5. In this case, the arc discharge is initiated solely by an increase in voltage or in conjunction with the generation of a short circuit. In this case too, a target connected as cathode and an anode in a vacuum chamber are used once again, between which an arc is ignited, preferably in pulsed form, and a plasma is generated from the target material. However, if, after ignition, a continuous arc discharge is used, the arc should be guided along the surface of the target with the aid of controllable magnetic fields.

In this case too, the absorber electrode is once again arranged in the immediate vicinity of the target and/or the anode. An electric field is generated around the absorber electrode, the absorber electrode once again being held at an electrically positive potential compared to the plasma, so that the positive particles of the particle flow are moved out of the plasma toward the substrate, where the layer is formed, without the larger particles or particles with a higher mass charge in the particle flow reaching the substrate, since they come into contact with the absorber electrode, where they can be absorbed.

However, the absorber electrode which is to be used according to the invention may also be used in a device or a method in which the plasma is generated from a target using a laser beam which is directed onto this target. A procedure of this type is described, for example, in U.S. Pat. No. 4,987,007. In this case, it is also possible to generate a plasma from a target material which is not conductive. In this case too; the absorber electrode is once again arranged in the immediate vicinity of the root of the plasma, i.e. the point where the laser beam is focused onto the target. In this case too, the separation of the differently charged particles of the ionized particle flow is carried out in the form which has already been described for the other options, so that virtually only positively charged particles of the particle flow reach the substrate, where they form the layer.

The invention may advantageously be developed further as a result of the absorber electrode and/or the substrate being arranged or formed in such a way that it is impossible for any particles and ions from the plasma to reach the substrate directly. For this purpose, it is also additionally possible to employ a shielding diaphragm which may be arranged accordingly between target and substrate.

An element which forms the absorber electrode should encompass a plane which is arranged, oriented and dimensioned in such a way that the particle flow of the plasma cannot reach the substrate directly. In the most simple case, it may be a correspondingly inclined planar plane. However, it is also possible for a convexly curved plane to be encompassed.

A plane of this type does not necessarily have to be a continuous area, but rather it is also possible to use elements with gaps, such as for example grids, perforated or slotted metal sheets or other structural elements.

The inventive effect of the absorber electrode used is based on the high degree of ionization of the plasma which can be achieved with the methods listed above without the ions having to have a high kinetic energy. The energy of the ions is in this case between 30 and 100 eV. It is known that the degree of ionization of a plasma in the case of a vacuum arc discharge is approximately 80 to 90%.

The absorber electrode has the sole function of separating the differently charged particles of the particle stream out of the plasma and does not cause the ionized particles to be accelerated.

The arrangement of the absorber electrode in the immediate vicinity of the anode or target leads to a very large proportion of the electrons and negatively charged ions being absorbed and, at the same time, prevents the degree of ionization of the ions from changing significantly, through recombination processes, before leaving the diverter arrangement which is formed by the absorber electrode together with the electric field.

The coating rate can be positively influenced if the absorber electrode, the substrate and the other components which may be required for the generation of the plasma are designed and/or arranged in an advantageous way. Particularly suitable embodiments are described in more detail below.

With a corresponding shape of the absorber electrode, it is possible to ensure that, when the plasma enters the electric field generated around the absorber electrode, the electric field vector is oriented orthogonally to the direction of movement of the ion current, so that there is only a slight influence on the kinetic energy of the ions. For this reason, virtually only the ions can be optimally diverted as positively charge space charge to the substrate, on account of the effect of the electric field. The substrate is only slightly heated, so that the actual coating operation can be carried out virtually at room temperature, so that even corresponding thermally sensitive substrates can be coated without difficulty.

The energy of the ions and therefore also the properties of the layer formed can be influenced in a controlled way by a negative voltage applied to the substrate.

Furthermore, it may be beneficial for an element which is in grid form, for example, and is made from an electrically conductive material to be arranged between the root of the plasma and the absorber electrode, through which element the plasma is passed. A grid-like element of this type may be at the electric potential of the anode. Moreover, it may be advantageous for the grid-like element to be designed so as to be curved toward the direction of movement of the plasma. The grid-like element may be connected to the anode and, if appropriate, a diaphragm which is used and consequently may also be attached thereto.

The invention may advantageously also be used to form reactively influenced layers. Gases can be supplied for this purpose. These gases are ionized in the vicinity of the absorber electrode and are chemically activated, so that, for example, oxide, carbide or nitride layers or a combination, such as for example carbonitrides, can be produced using, for example, nitrogen, oxygen, $H_2$, hydrocarbons, at a low mass flow rate and consequently very low gas pressures of below $10^{-1}$ Pa.

The invention is to be described by way of example below. In the drawing:

FIG. 6 shows a further example of a device according to the invention with an absorber electrode which fulfils the anode function for the generation of plasma by means of arc discharge.

In all the devices shown in FIGS. 1 to 6, the vacuum chamber in which the individual components shown in the figures are accommodated has not been illustrated, since it can be assumed that this is obvious to the appropriate person skilled in the art.

Figure 1:
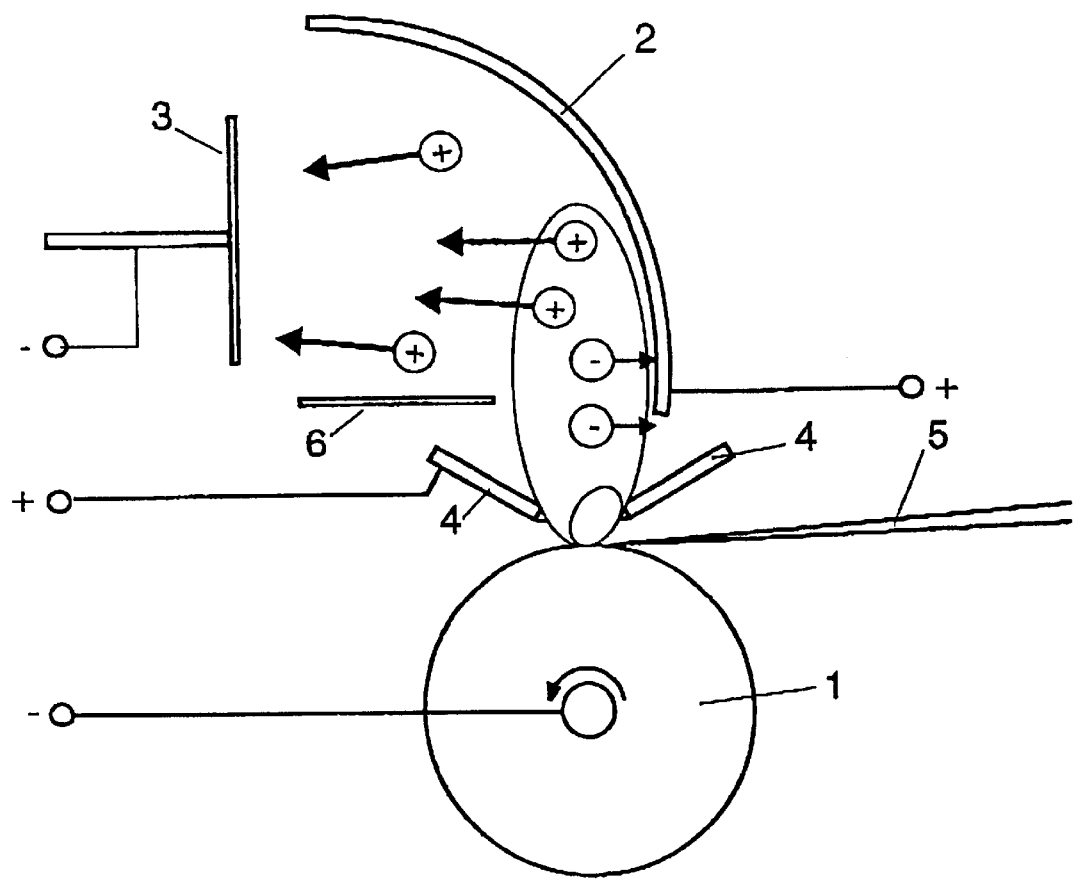
FIG. 1 shows an example of a device according to the invention in which a plasma is generated using a laser arc method and a curved absorber electrode is employed.
Figure 1A:
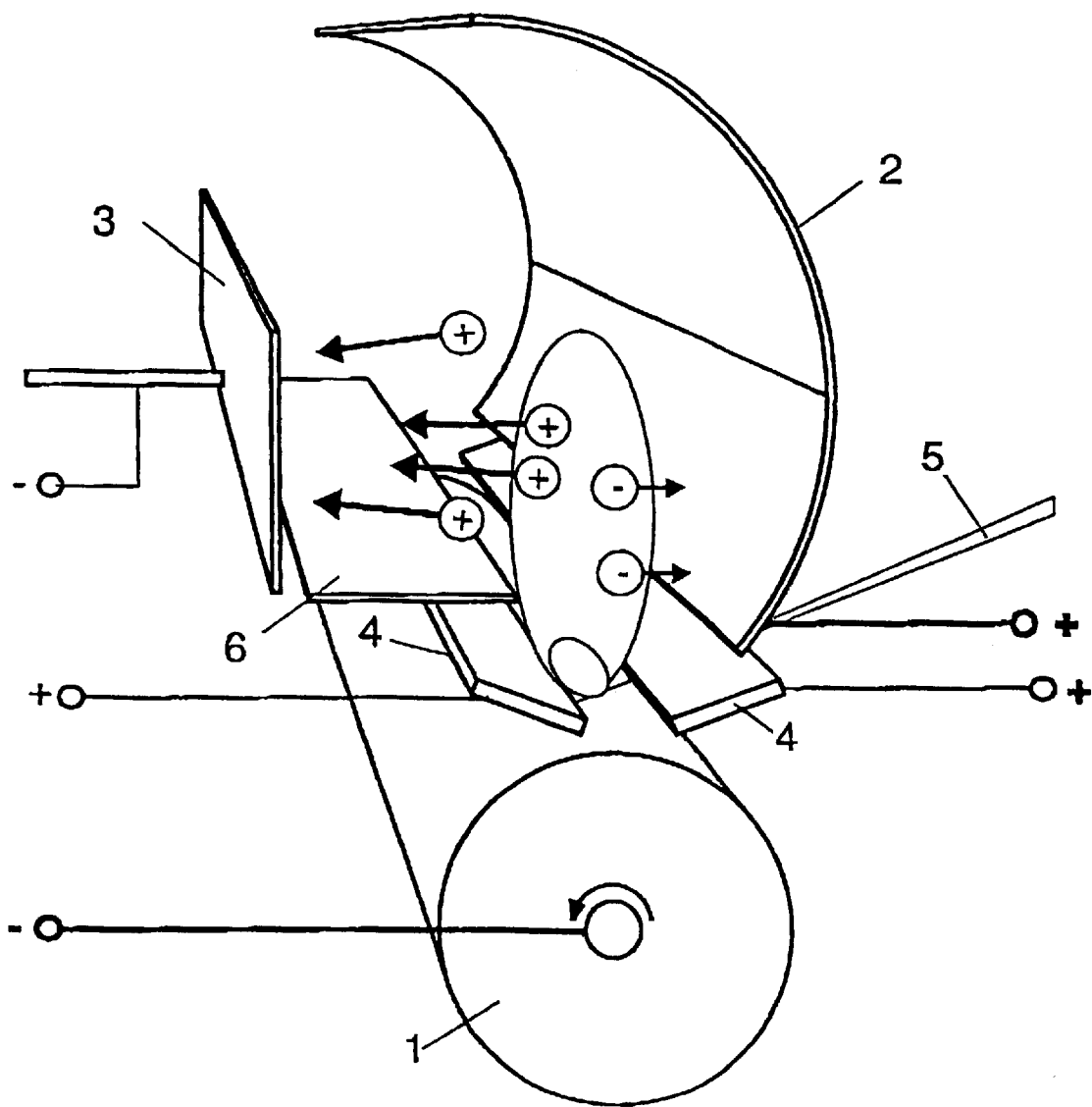
FIG. 1a shows a perspective view of the example shown in FIG. 1.
Figure 2:
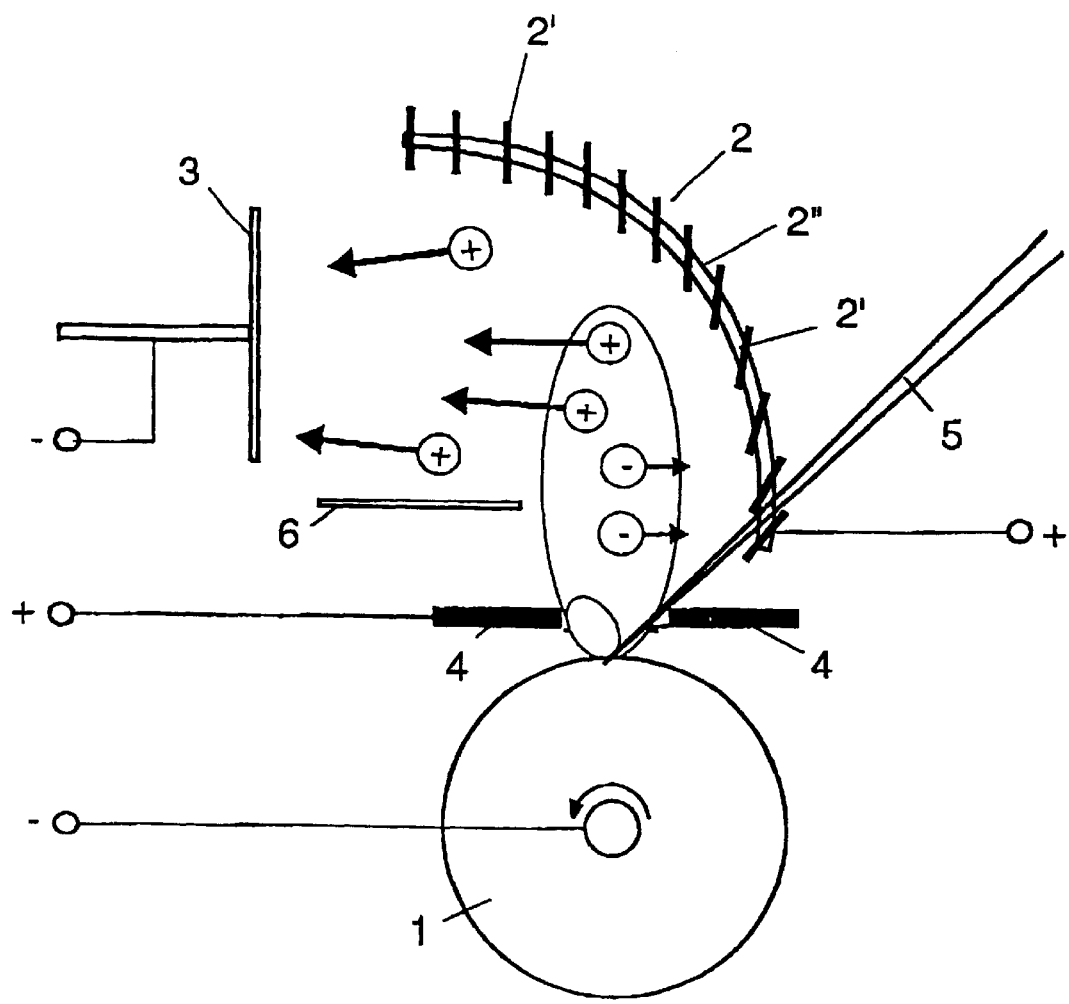
FIG. 2 shows an example of a device according to the invention, in which a plasma is generated using a laser arc method and a curved absorber electrode formed from a plurality of strips is employed.
Figure 2A:
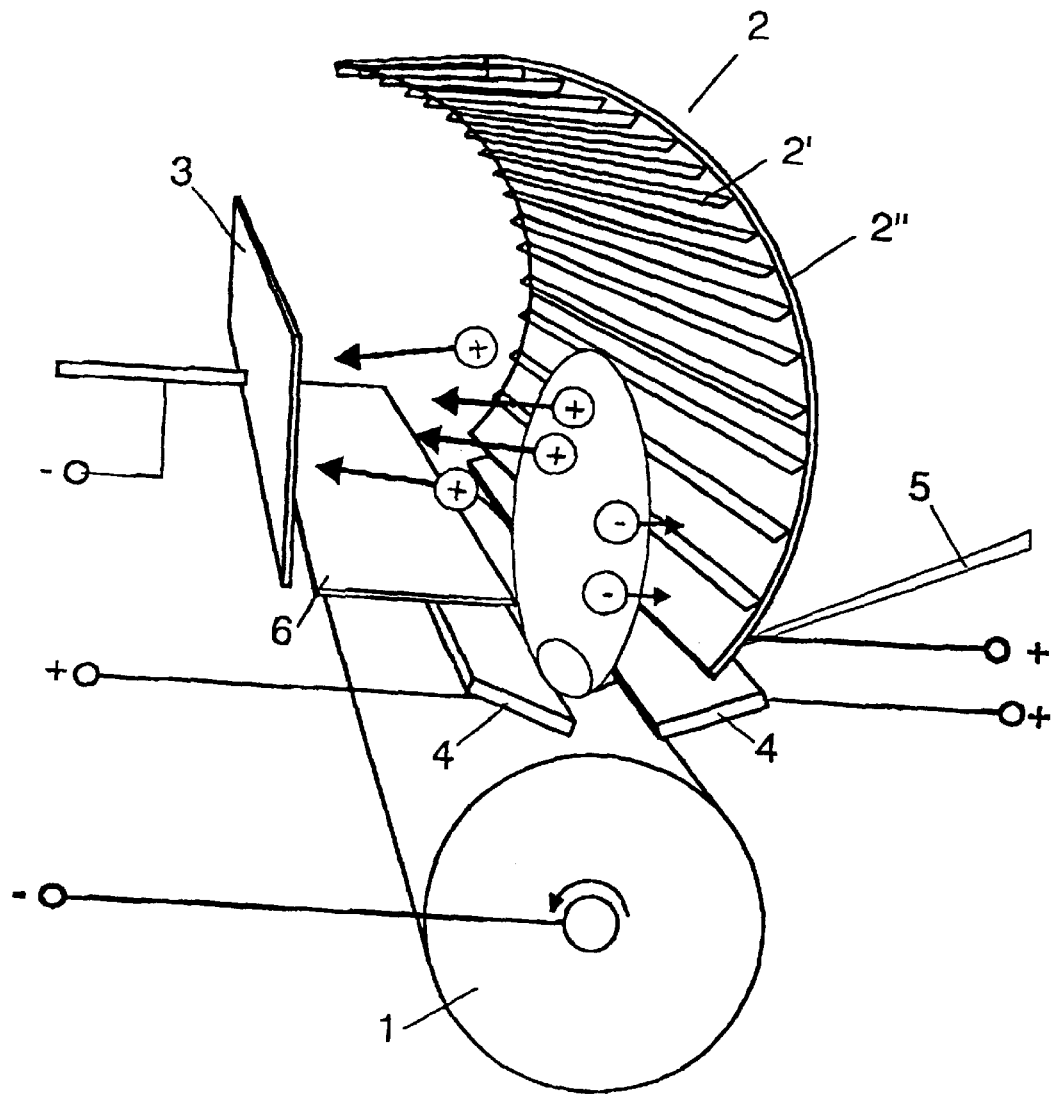
FIG. 2a shows a perspective view of the example shown in FIG. 2.

In the example of a device according to the invention which is shown in FIG. 1, a target 1 which is in the form of a roller and is rotated uniformly about its longitudinal axis is used. To generate a plasma from an arc discharge, an anode 4 is used which, in preferred form, is designed as an anode screen with a central gap through which the plasma generated can emerge, as indicated by the form of the anode 4 illustrated in FIGS. 1 and 1a, as well as FIGS. 2, 2a and 4. To ignite the vacuum arc discharge, a laser beam 5 in pulsed form is directed onto the circumferential surface of the target 1 and, at the same time, the anode voltage is increased accordingly, so that an arc discharge can be ignited between target 1 and anode 4 and, following the vaporization of target material, a plasma can be generated, which passes through the anode gap toward the absorber electrode 2, which in this case is curved and is designed so as to follow the shape of a part of a circle.

The absorber electrode 2 is connected to a DC voltage. This voltage at the absorber electrode 2 is higher than the normal voltage at the anode 4 and the potential of the plasma.

The absorber electrode 2 can be used to separate the differently charged particles in the ionized particle flow out of the plasma. To do this, the negatively charged ion particles are absorbed by the absorber electrode 2, and the positively charged particles from the particle flow can move toward the substrate 3 and, on the surface of the latter, form the desired layer, which is virtually free of particles and droplets. The electric field which is formed between absorber electrode 2 and substrate 3 only has a positive effect for the desired charge separation, and the kinetic energy of the positively charged particles is not additionally increased.

In this example, an electrically negative potential is applied to the substrate 3, which may be advantageous for certain purposes. However, it is not generally necessary for the substrate to be at an electrically negative potential, but rather connection to the ground of the device may readily be sufficient.

As can be seen clearly in FIG. 1, the voltage connection to the absorber electrode 2 is advantageously situated on that side of the absorber electrode 2 which faces the target 1, as close as possible to the root of the plasma.

To prevent ionized particles from moving immediately, i.e. along a straight, direct path, toward the substrate 3, it is possible to use a diaphragm 6 which is arranged between target 1 and substrate 3. It only leaves a restricted gap between diaphragm 6 and absorber electrode 2 for the plasma to pass through.

This method or a device of this type can be used to coat relatively large-area substrates 3, and correspondingly long targets 1 in roller form can be employed. In this case, correspondingly long absorber electrodes 2 should be used, so that the desired effect can be achieved over the entire target length and the entire area of the substrate 3 which is to be coated, by means of a correspondingly extensive electric field.

Figure 3:
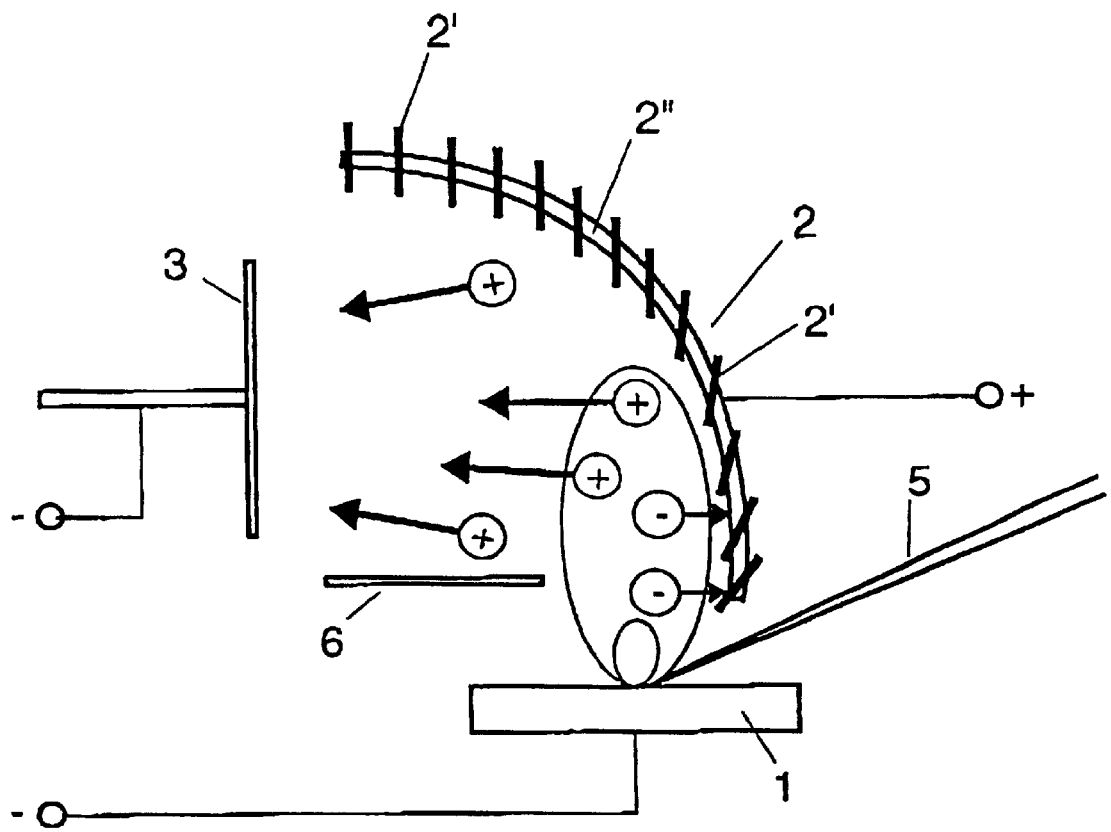
FIG. 3 shows an example of a device according to the invention in which a plasma is generated using a laser beam and a curved absorber electrode formed from a plurality of individual strips is employed.
Figure 3A:
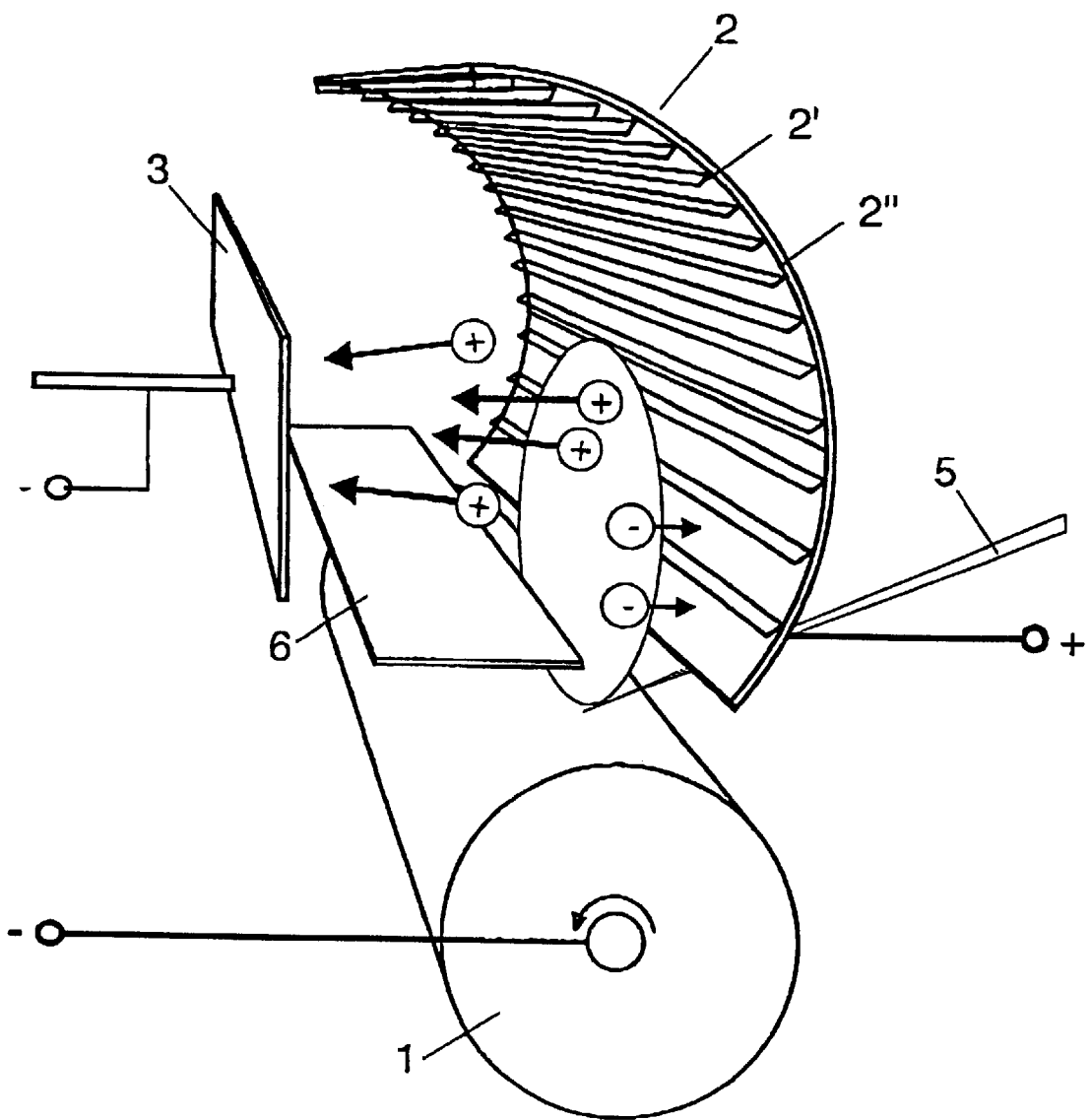
FIG. 3a shows a perspective view of the example shown in FIG. 3.

In the example of a device according to the invention which is shown in FIGS. 3 and 3a, the same individual components as in the example shown in FIG. 1 are used once again. The difference is only that the absorber electrode 2 is of modified design. The absorber electrode 2 in this case comprises a strip carrier 2", to which individual narrow strips 2' of electrically conductive material are attached at a distance from one another. The strips 2' are oriented in such a way that a reflected, ionized particle is reflected away from the substrate.

In the example of a device according to the invention which is shown in FIGS. 3 and 3a, a conventional target 1 is used, which in this case is at a negative potential, although this may also be dispensed with. A preferably pulsed laser beam 5 is directed onto the target 1, and the plasma is generated from the target material purely by the energy of this laser beam. The target 1 may consist of electrically conductive or electrically nonconductive material, depending on the type of layer which is to be formed on the substrate 3. Otherwise, this device is designed in exactly the same way as the example described in connection with FIG. 3. Naturally, it is also possible for embodiments in accordance with the other examples described, in particular for the design of the absorber electrode 2, to be used.

In a device as has been described by the examples based on FIGS. 1, 1a, 2 and 2a and which can be operated in combination with the known laser arc method, it is possible for a very wide variety of layers to be applied to a very wide variety of substrates. For example, it is possible for particle-free aluminum, various aluminum compounds (by the addition of correspondingly reactive gases) and also diamond-like carbon layers to be applied.

The coating of a substrate with aluminum is to be described below by way of example.

For this purpose, a roller-like aluminum target 1 is used and the anode 4 for generating the arc discharge in a vacuum and the absorber electrode 2 are of the same length as the aluminum target 1, which is in the form of a roller. In this example, an absorber electrode 2 in accordance with FIG. 1 is used, the radius of curvature of which is 60 mm. To ignite the vacuum arc discharge, a peak pulse voltage of approx. 400 V is applied to the anode 4. After the vacuum arc discharge has been ignited between anode 4 and target 1 with the aid of the laser beam 5 (power density $5*10^8$ W/cm$^2$), the anode voltage is reduced, within a few microseconds, to the arc discharge voltage of approx. 30 V. The current intensity of the arc discharge is approx. 1000 A, and the pulse frequency at which the vacuum arc discharge is carried out is approx. 100 Hz.

It was possible to hold the voltage at the absorber electrode 2 at mean values in the range between 180 V and 200 V and to hold the mean current intensity at 3 A.

The substrate 3, which is suspended in isolation in the vacuum chamber, unlike the illustrations given by way of example, can be held at ground potential. With an arrangement of this type, it is possible to realize coating rates which are achieved at approx. 40% of a procedure without the solution according to the invention, i.e. without additional absorber electrode.

Figure 4:
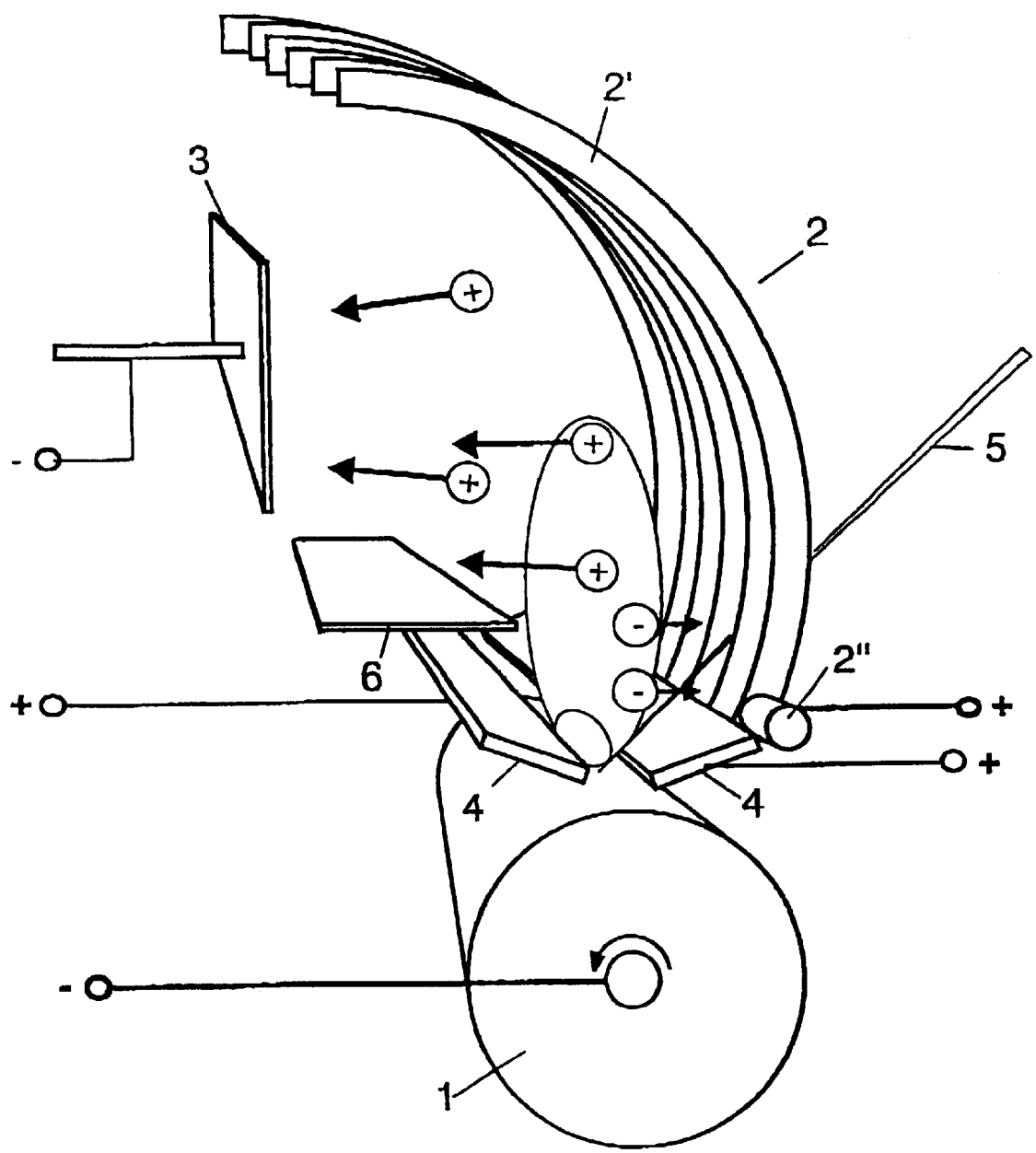
FIG. 4 shows an example of a device according to the invention with absorber electrode formed from strip-like elements.

However, the absorber electrode 2 may also be designed as shown in FIG. 4. It is formed from a plurality of planar, large-area elements (strips 2') arranged at a distance from one another, the individual elements being oriented parallel to one another and the individual elements which form the absorber electrode 2 being oriented orthogonally to the longitudinal direction of the target 1, so that any relatively large droplets which may be present in the plasma can be discharged through the spaces between adjacent large-area elements and consequently it is possible to prevent such droplets from being deposited on the substrate 3.

The planar, large-area elements (strips 2') of an absorber electrode 2 designed in this way may, on the side facing the plasma, preferably be shaped in the manner shown for the strip carriers 2" in FIGS. 3 and 4. The individual planar, large-area elements 2' may be connected, including in an electrically conductive manner, to spacers arranged in at least one axis.

In this example, the individual strips 2' are arranged next to one another in the manner of a comb and are convexly curved.

Since the position of the root of the plasma on the target surface may change, it is advantageous for the individual strips 2' to be activated separately, i.e. for each strip 2' to have a separate current supply, so that only the strips 2' which are able to actively influence the plasma generated are supplied with a correspondingly sufficiently high electric current. The other strips 2' may be acted on by a lower voltage or may even be connected with no voltage. It is thus possible, for example, to supply adjacent strips 2' over a length of approx. 100 to 400 mm with electric current, the way in which the individual strips 2' are switched on and off being intended to be controlled taking into account the position of the root of the plasma on the target 1. This can be achieved, for example, by taking into account the beam direction or deflection of the laser beam 5.

Figure 5:
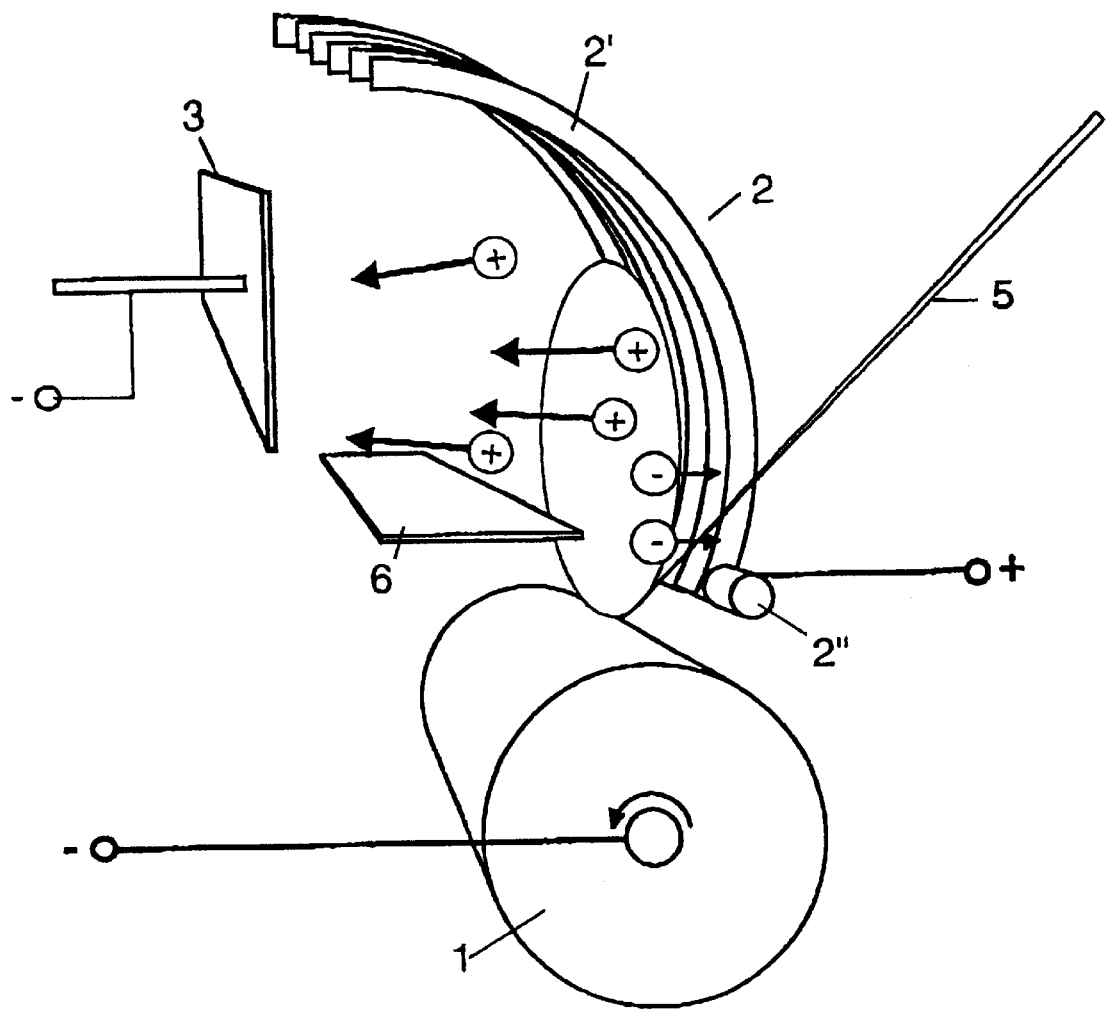
FIG. 5 shows an example of a device according to the invention with absorber electrode formed from strip-like elements, in which the plasma is generated exclusively using a laser beam.

The example shown in FIG. 5 substantially corresponds to that described above. The only difference is that an additional anode 4 is dispensed with and the plasma is generated exclusively using the energy of the laser beam 5 which, as the target 1 simultaneously rotates, is deflected along the longitudinal axis thereof. In this case too, the supply of current to the individual strips 2' of the absorber electrode 2 can be controlled accordingly.

The example shown in FIG. 6 dispenses with an additional anode 4, the function of which is assumed by the absorber electrode 2. Consequently, the arc discharge is initiated by the absorber electrode 2, if appropriate with assistance from a pulsed laser beam 5.

In this case, the current is supplied to the absorber electrode 2 as far away from the root of the plasma as possible, and consequently at or in the vicinity of that end face of the absorber electrode 2 which faces toward the substrate 3. The greater the distance, the more effectively the absorber electrode 2 operates.

In this case too, it may be advantageous for the current supply to be controlled locally as a function of the corresponding position of the root of the plasma.

This can be achieved by corresponding movement of a current supply to the absorber electrode 2 parallel to the surface of the target 1, along its longitudinal axis.

However, it is simpler, with a large-area, planar, continuous absorber electrode (e.g. metal sheet or grid), to form slots which start from the end side facing target 1 and end shortly before that end side of the absorber electrode 2 which faces toward the substrate. As a result, direct flow of current from the current supply into the active region of the plasma is prevented with the aid of these slots if the plasma root is situated at a distance from the current supply, which is generally arranged centrally on the absorber electrode 2.

What is claimed is:

1. A device for coating substrates in a vacuum using methods in which a plasma is generated from a target and ionized particles of the plasma are deposited on the substrate in the form of a layer, said device comprising an absorber electrode which is at an electrically positive potential with respect to the plasma, wherein the absorber electrode, as a deflecting arrangement for the ions of the plasma, is designed in the form of a curve and is arranged between the target and the substrate curving from the target toward the substrate and having a voltage connection arranged on a portion of the absorber electrode that is located nearest to the target.

2. The device as claimed in claim 1, wherein the field vector of the electric field which forms around the absorber electrode is oriented at least approximately orthogonally to the direction of movement of the ionized particles of the plasma.

3. The device as claimed in claim 1, wherein a mean voltage in the range from 180 to 200 V is applied to the absorber electrode.

4. The device as claimed in claim 1, wherein the target, which is connected as cathode, is designed in the form of a roller and is arranged rotatably, and a pulsed laser beam can be deflected, parallel to a plane of the axis of rotation of the target, onto the circumferential surface thereof.

5. The device as claimed in claim 4, wherein the absorber electrode is dimensioned in such a way that the electric field is formed at least approximately in the entire space between absorber electrode and substrate, and/or the length of the absorber electrode corresponds to the length of the target measured along the axis of rotation.

6. The device as claimed in claim 4, wherein the absorber electrode is formed from a plurality of planar, large area elements which are arranged parallel to and at a distance from one another, are oriented orthogonally to the axis of rotation of the target and are curved toward the substrate.

7. The device as claimed in claim 1, wherein a diaphragm, which prevents the direct impingment of ionized particles, is arranged between the substrate and the target.

8. The device as claimed in claim 1, wherein the absorber electrode, is designed in the form of an element which encompasses a plane.

9. The device as claimed in claim 1, wherein the curved absorber electrode is designed in the form of part of a circle, curved toward the substrate.

10. The device as claimed in claim 1, wherein the absorber electrode is formed from a plurality of strips.

11. The device as claimed in claim 1, wherein a grid-like element made from electrically conductive material, through which the plasma is passed, is arranged between the root of the plasma and absorber electrode.

12. A method for coating substrates in a vacuum comprising generating a plasma from a target; providing an absorber electrode between the target and the substrate in the form of a curve curved from the target to the substrate; supplying a voltage to a portion of the absorber electrode nearest to the target; passing ionized particles and electrons of the plasma through an electric field which is generated around an absorber electrode; depositing positively ionized particles of the plasma on the substrate in the form of a layer; wherein electrons are absorbed by the absorber electrode; and diverting the positive ions of the plasma to the substrate by means of the absorber electrode.

13. The method as claimed in claim 12, wherein the plasma is generated from the target by means of pulsed energy and the voltage at the absorber electrode is likewise operated in pulsed form.

14. The method as claimed in claim 12, wherein the plasma is generated by means of arc discharge between the target, which is connected as cathode, and an anode, and the voltage of the absorber electrode is kept higher than the voltage of the anode.

15. The method as claimed in claim 14, wherein the plasma is generated by means of pulsed arc discharge.

16. The method as claimed in claim 14, wherein the voltage of the absorber electrode is connected downstream of the voltage of the anode.

17. The method as claimed in claim 14, wherein the arc discharge is ignited between the target connected as cathode and the anode by means of a pulsed laser beam.

18. The method as claimed in claim 17, wherein a target, which is in the form of a roller, is rotated uniformly about its longitudinal axis and the pulsed laser beam is deflected along a plane running parallel to the axis of rotation of the target, over the circumferential surface thereof.

19. The method as claimed in claim 12, wherein the plasma is generated by means of arc discharge between the target, which is connected as cathode, and the absorber electrode.

* * * * *